US012406939B2

(12) United States Patent
Lin

(10) Patent No.: US 12,406,939 B2
(45) Date of Patent: Sep. 2, 2025

(54) SEMICONDUCTOR STRUCTURE AND MANUFACTURING METHOD THEREOF

(71) Applicant: Winbond Electronics Corp., Taichung (TW)

(72) Inventor: Chang-Hung Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 485 days.

(21) Appl. No.: 17/954,350

(22) Filed: Sep. 28, 2022

(65) Prior Publication Data

US 2024/0105634 A1    Mar. 28, 2024

(51) Int. Cl.
   *H01L 23/544*    (2006.01)

(52) U.S. Cl.
   CPC .. *H01L 23/544* (2013.01); *H01L 2223/54426* (2013.01)

(58) Field of Classification Search
   CPC .............................. H01L 2223/54426
   See application file for complete search history.

(56) References Cited

U.S. PATENT DOCUMENTS

| 11,037,882 | B2 | 6/2021 | Chen et al. | |
|---|---|---|---|---|
| 2019/0355679 | A1* | 11/2019 | Wu | H01Q 1/2283 |
| 2019/0393159 | A1 | 12/2019 | Chen et al. | |

FOREIGN PATENT DOCUMENTS

| JP | 2023119771 | * | 8/2023 |
|---|---|---|---|
| TW | 201701444 | | 1/2017 |
| TW | I767844 | | 6/2022 |

OTHER PUBLICATIONS

"Office Action of Taiwan Counterpart Application", issued on May 5, 2023, p. 1-p. 5.

* cited by examiner

*Primary Examiner* — Walter H Swanson
(74) *Attorney, Agent, or Firm* — JCIPRNET

(57) ABSTRACT

A semiconductor structure including a substrate and a monitoring mark is provided. The substrate includes a monitoring region. The monitoring mark is located in the monitoring region. The top-view pattern of the monitoring mark includes a curved line and a recess. The curved line and the recess are opposite to each other, the curved line has a vertex, and the recess has a right-angled corner.

20 Claims, 16 Drawing Sheets

SEMICONDUCTOR STRUCTURE AND MANUFACTURING METHOD THEREOF

BACKGROUND

Technical Field

The invention relates to a semiconductor structure and a manufacturing method thereof, and particularly relates to a semiconductor structure having a monitoring mark and a manufacturing method thereof.

Description of Related Art

Currently, in the process of forming the active region, the active region is often shifted in the extension direction of the active region due to an overlay shift. However, the conventional monitoring method cannot monitor whether the active region is shifted in the extension direction of the active region, so it is difficult to form the active region in a predetermined ideal position.

SUMMARY

The invention provides a semiconductor structure and a manufacturing method thereof, which can monitor whether the active region is shifted in the extension direction of the active region by the monitoring mark and can measure the offset of the active region in the extension direction of the active region by the monitoring mark.

The invention provides a semiconductor structure, which includes a substrate and a monitoring mark. The substrate includes a monitoring region. The monitoring mark is located in the monitoring region. The top-view pattern of the monitoring mark includes a curved line and a recess. The curved line and the recess are opposite to each other, the curved line has a vertex, and the recess has a right-angled corner.

The invention provides a manufacturing method of a semiconductor structure, which includes the following steps. A substrate is provided. The substrate includes a monitoring region. A monitoring mark is formed in the monitoring region. The top-view pattern of the monitoring mark includes a curved line and a recess. The curved line and the recess are opposite to each other, the curved line has a vertex, and the recess has a right-angled corner.

Based on the above description, in the semiconductor structure and the manufacturing method thereof according to the invention, the top-view pattern of the monitoring mark includes the curved line and the recess, the curved line and the recess are opposite to each other, the curved line has the vertex, and the recess has the right-angled corner. Therefore, the monitoring mark can be used to monitor whether the active region is shifted in the extension direction of the active region, the X direction, and/or the Y direction, and the monitoring mark can be used to measure the offset of the active region in the extension direction of the active region, the X direction, and/or the Y direction.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

For the sake of easy understanding, the same components in the following description will be denoted by the same reference symbols. In addition, the drawings are for illustrative purposes only and are not drawn to the original dimensions. Furthermore, the features in the top view and the features in the cross-sectional view are not drawn to the same scale. In fact, the dimensions of the various features may be arbitrarily increased or reduced for clarity of discussion.

FIG. 1A to FIG. 1G are top views illustrating a manufacturing process of a semiconductor structure according to some embodiments of the invention. FIG. 2A to FIG. 2G are cross-sectional views taken along section line I-I' and section line II-II' in FIG. 1A to FIG. 1G. In the top view of the present embodiment, some components in the cross-sectional view may be omitted to clearly illustrate the configuration relationship between the components in the top view.

Figure 1A:
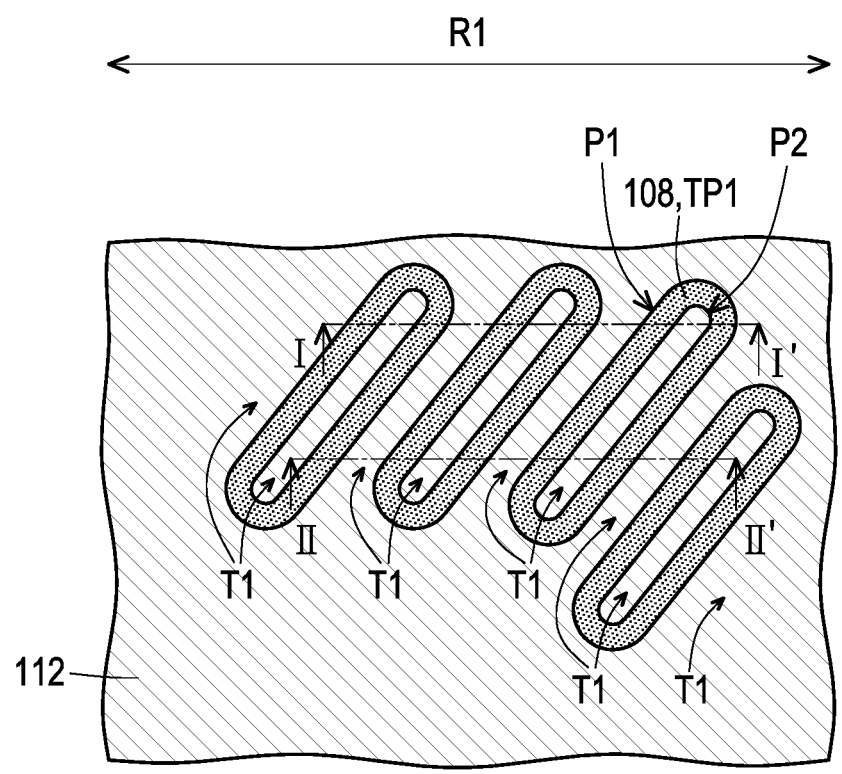
FIG. 1A to FIG. 1G are top views illustrating a manufacturing process of a semiconductor structure according to some embodiments of the invention.
Figure 2A:
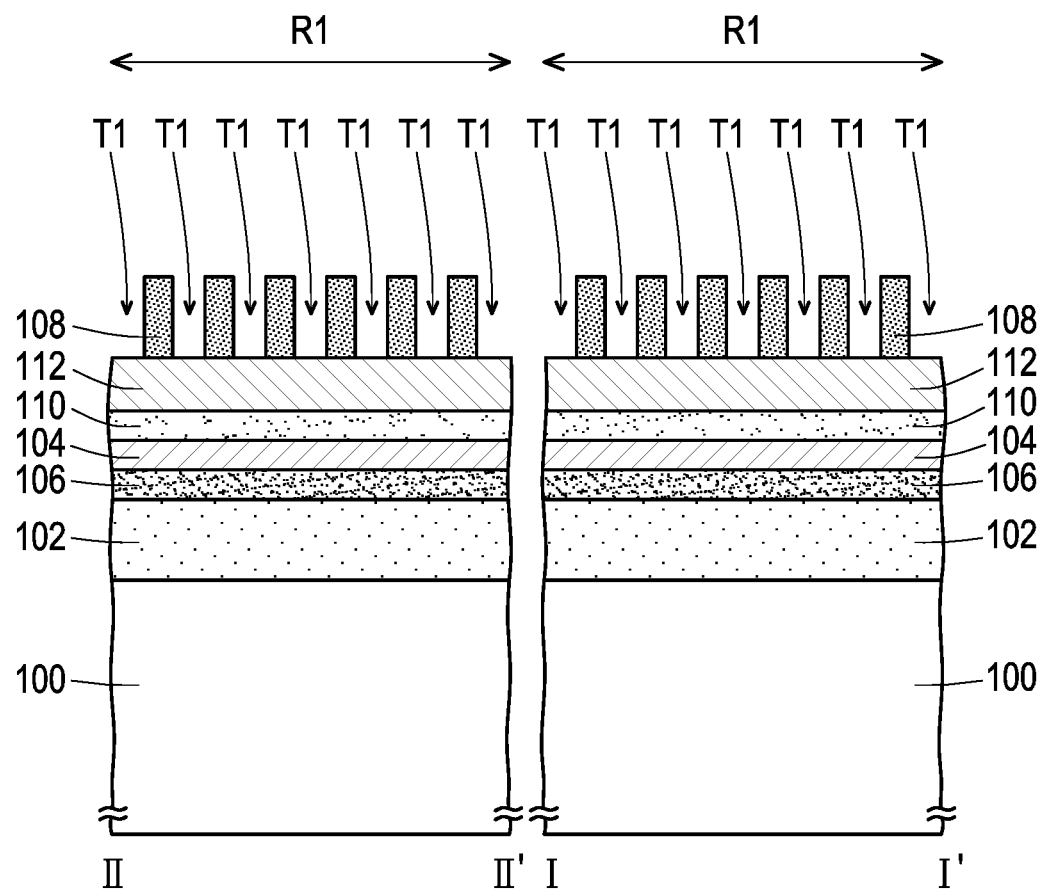
FIG. 2A to FIG. 2G are cross-sectional views taken along section line I-I' and section line II-II' in FIG. 1A to FIG. 1G.

Referring to FIG. 1A and FIG. 2A, a substrate 100 is provided. The substrate 100 includes a monitoring region R1. The substrate 100 may be a semiconductor substrate such as a silicon substrate. A mask layer 102 may be formed on the substrate 100. The material of the mask layer 102 is, for example, oxide (e.g., silicon oxide). The method of forming the mask layer 102 is, for example, a chemical vapor deposition (CVD) method.

A mask layer 104 may be formed on the mask layer 102. The material of the mask layer 104 is, for example, polysilicon. The method of forming the mask layer 104 is, for example, a CVD method. In some embodiments, before the mask layer 104 is formed, a mask layer 106 may be formed on the mask layer 102. The mask layer 104 may be formed on the mask layer 106. The material of the mask layer 106 is, for example, silicon oxynitride. The method of forming the mask layer 106 is, for example, a CVD method.

A patterned mask layer 108 may be formed on the mask layer 104. The top-view pattern of the patterned mask layer 108 may include a ring-shaped pattern TP1 (FIG. 1A). In some embodiments, the ring-shaped pattern TP1 may include an outer contour P1 and an inner contour P2. The outer contour P1 may surround the inner contour P2. In some embodiments, the contour lines of two sides of the outer contour P1 include curves (e.g., are lines). In some embodiments, the contour lines of two sides of the inner contour P2 include curves (e.g., are lines). In addition, there are trenches T1 in the patterned mask layer 108. The trenches T1 are located on two sides of the ring-shaped pattern TP1 and in the ring-shaped pattern TP1. The material of the patterned mask layer 108 is, for example, oxide (e.g., silicon oxide). The method of forming the patterned mask layer 108 may include performing a self-aligned double patterning (SADP) process.

In some embodiments, before the patterned mask layer 108 is formed, a mask layer 110 may be formed on the mask layer 104. The material of the mask layer 110 is, for example, silicon oxynitride. The method of forming the mask layer 110 is, for example, a CVD method. In some embodiments, a mask layer 112 may be formed on the mask layer 110. The patterned mask layer 108 may be formed on the mask layer 112. In some embodiments, the trench T1 may expose a portion of the mask layer 112. The material of the mask layer 112 is, for example, polysilicon. The method of forming the mask layer 112 is, for example, a CVD method.

Figure 1B:
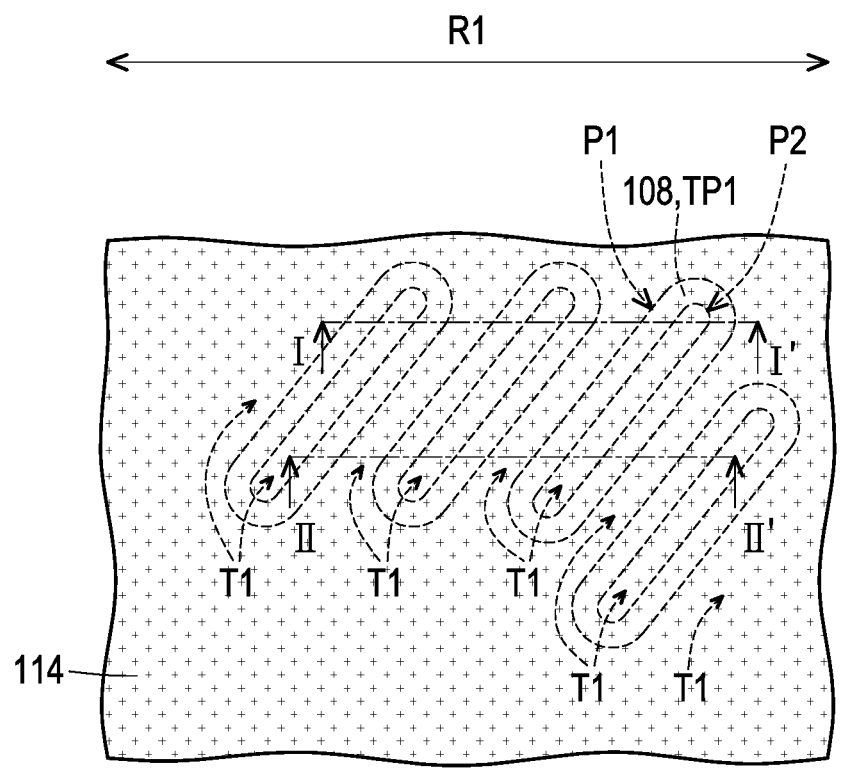
Figure 2B:
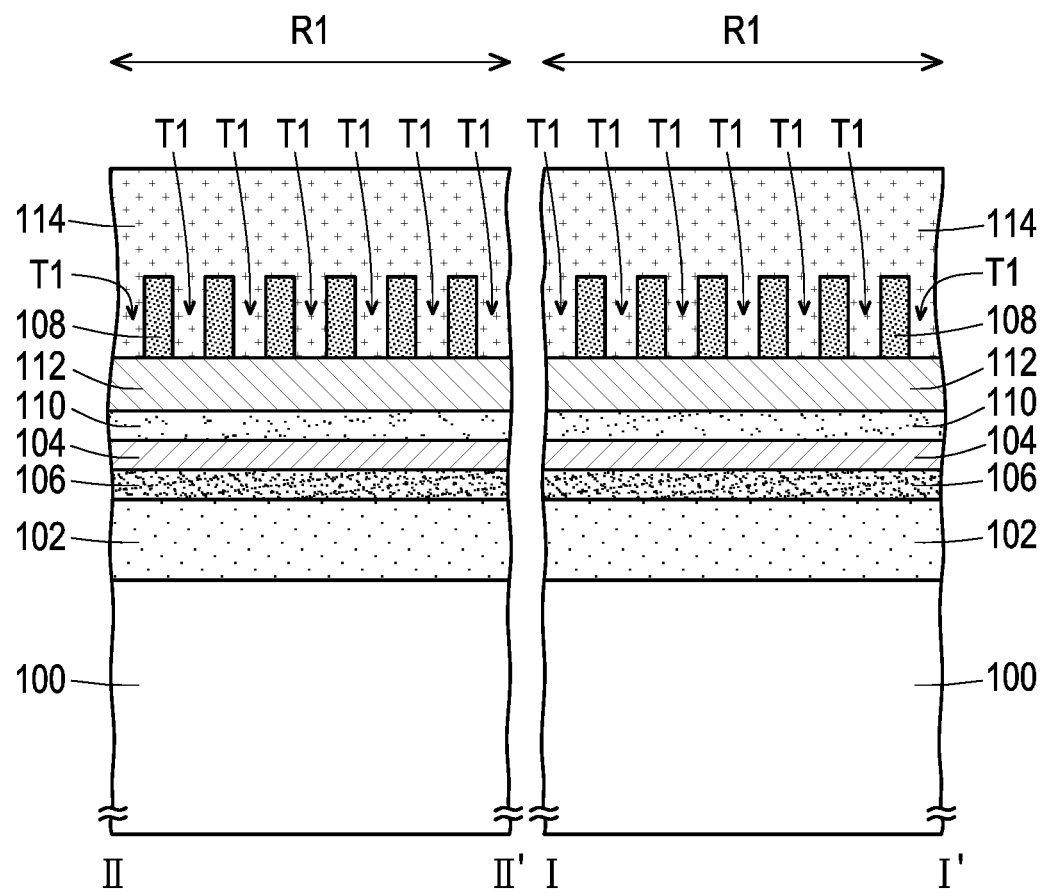

Referring to FIG. 1B and FIG. 2B, a filling material layer 114 may be formed on the patterned mask layer 108. The filling material layer 114 may fill the trenches T1. In some embodiments, the filling material layer 114 may be further formed on the mask layer 112. The material of the filling material layer 114 is, for example, spin on carbon (SOC). The method of forming the filling material layer 114 is, for example, a spin coating method.

Figure 1C:
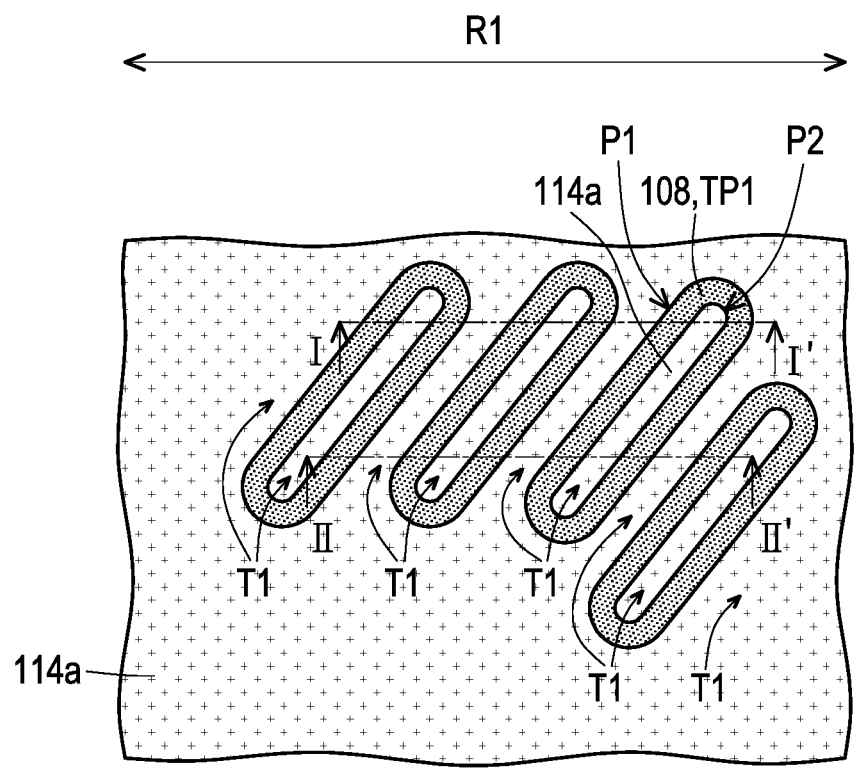
Figure 2C:
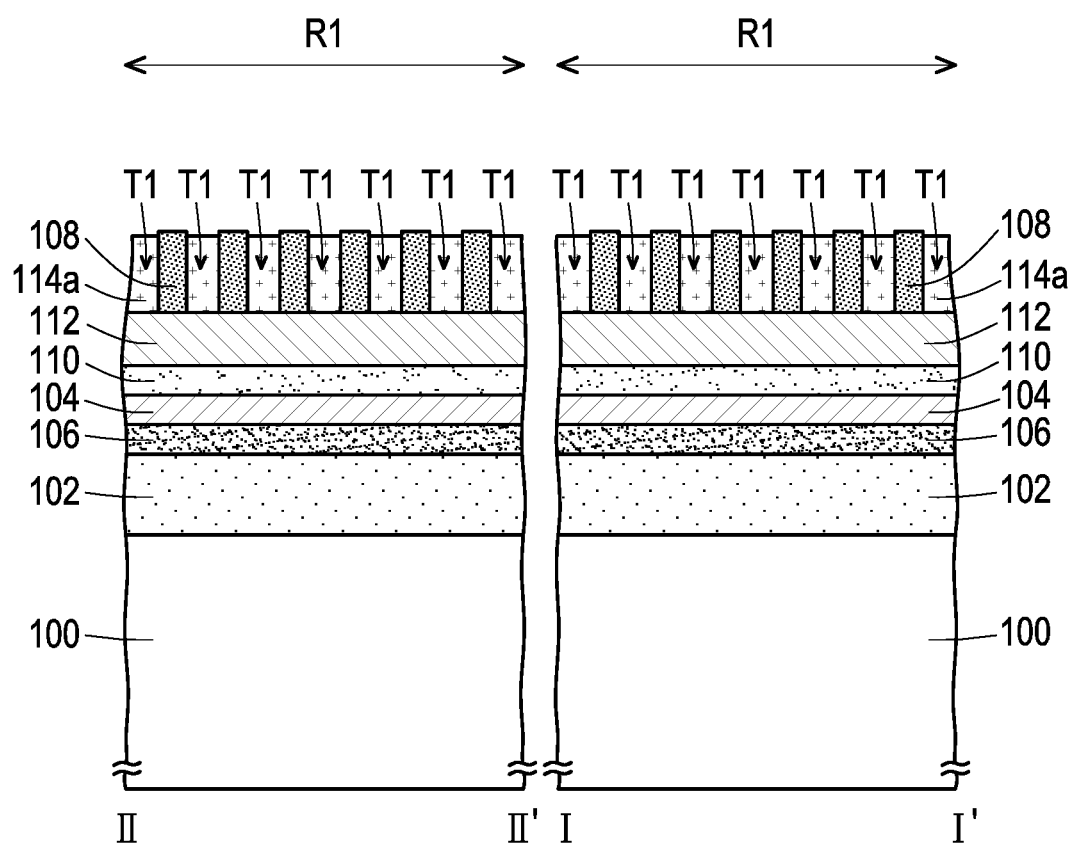

Referring to FIG. 1C and FIG. 2C, the filling material layer 114 located outside the trenches T1 may be removed to form a filling layer 114a. Therefore, the filling layer 114a may be formed in the trenches T1. In some embodiments, the method of removing the filling material layer 114 located outside the trenches T1 is, for example, an etch-back method.

Figure 1D:
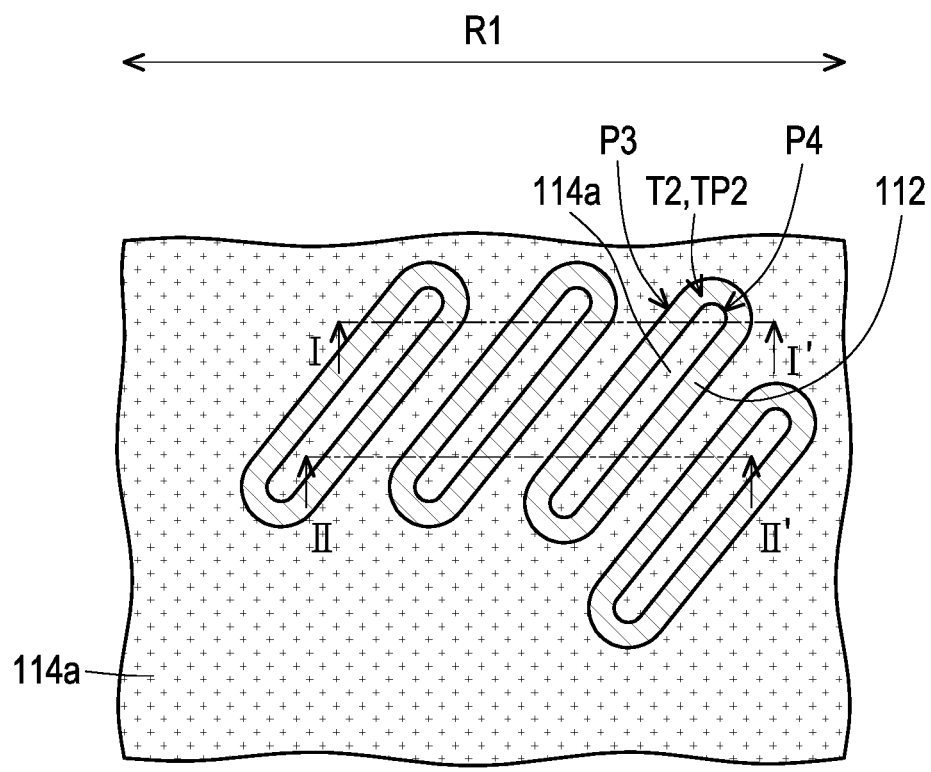
Figure 2D:
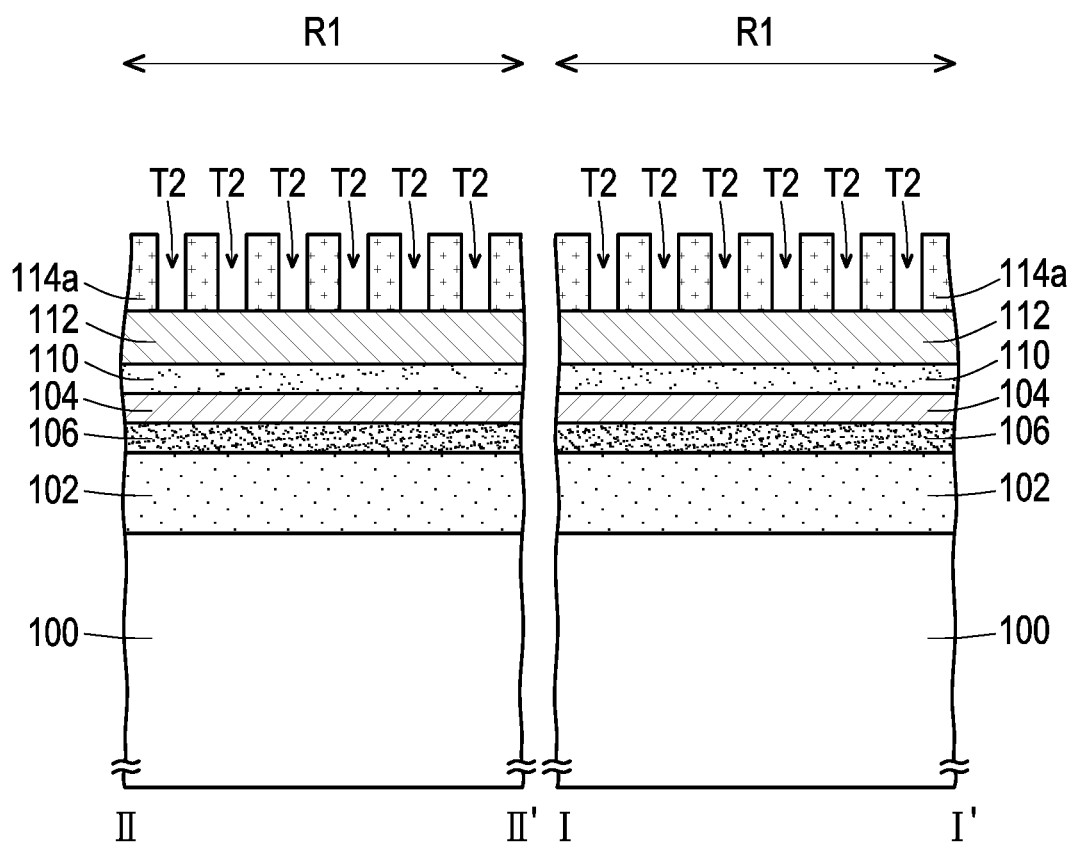

Referring to FIG. 1D and FIG. 2D, the patterned mask layer 108 may be removed, so that the filling layer 114a has trenches T2. In some embodiments, the trench T2 may expose a portion of the mask layer 112. The top-view pattern of trench T2 may include a ring-shaped pattern TP2 (FIG. 1D). In some embodiments, the ring-shaped pattern TP2 may include an outer contour P3 and an inner contour P4. The outer contour P3 may surround the inner contour P4. In some embodiments, the contour lines of two sides of the outer contour P3 include curves (e.g., are lines). In some embodiments, the contour lines of two sides of the inner contour P4 include curves (e.g., are lines). The method of removing the patterned mask layer 108 is, for example, a wet etching method or a dry etching method.

Figure 1E:
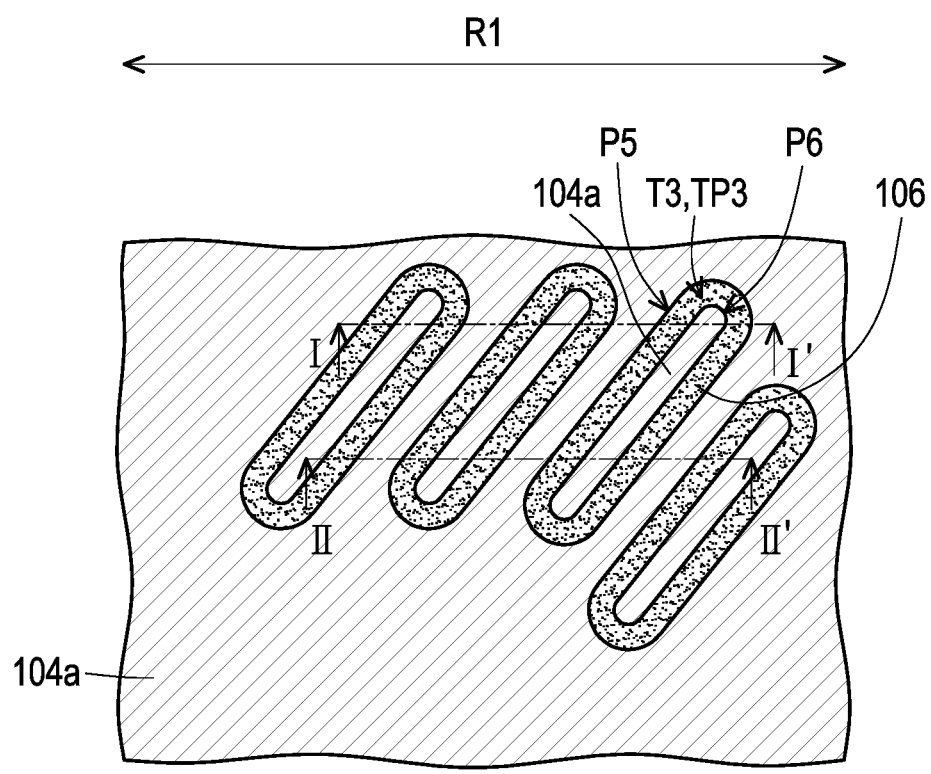
Figure 2E:
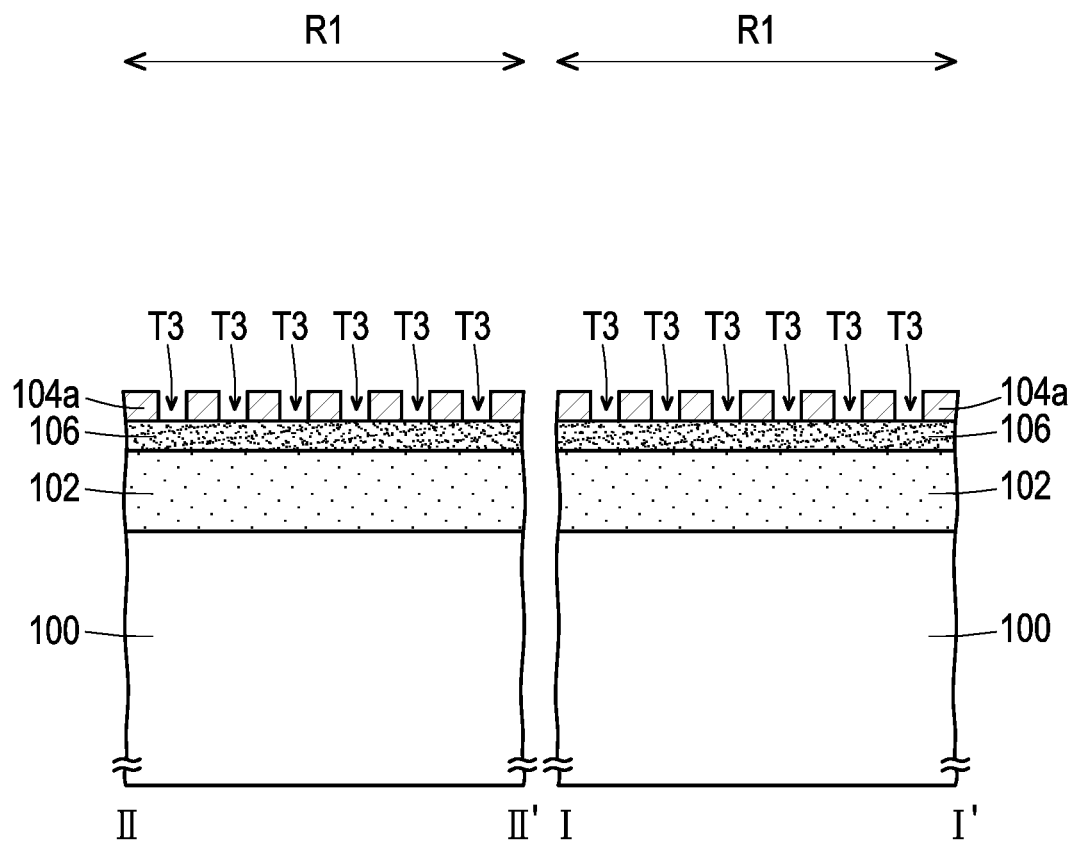

Referring to FIG. 1E and FIG. 2E, the pattern of the filling layer 114a may be transferred to the mask layer 104 to form a patterned mask layer 104a. The patterned mask layer 104a may have trenches T3. In some embodiments, the trench T3 may expose a portion of the mask layer 106. The top-view pattern of the trench T3 may include a ring-shaped pattern TP3 (FIG. 1E). In some embodiments, the ring-shaped pattern TP3 may include an outer contour P5 and an inner contour P6. The outer contour P5 may surround the inner contour P6. In some embodiments, the contour lines of two sides of the outer contour P5 include curves (e.g., are lines). In some embodiments, the contour lines of two sides of the inner contour P6 include curves (e.g., are lines).

In some embodiments, an etching process may be performed by using the filling layer 114a as a mask, so that the pattern of the filling layer 114a may be transferred to the mask layer 104 to form the patterned mask layer 104a. In some embodiments, the filling layer 114a, the mask layer 112, the mask layer 110, and a portion of the mask layer 104 may be removed during the process of forming the patterned mask layer 104a. In some embodiments, the etching process is, for example, a dry etching process.

Figure 1F:
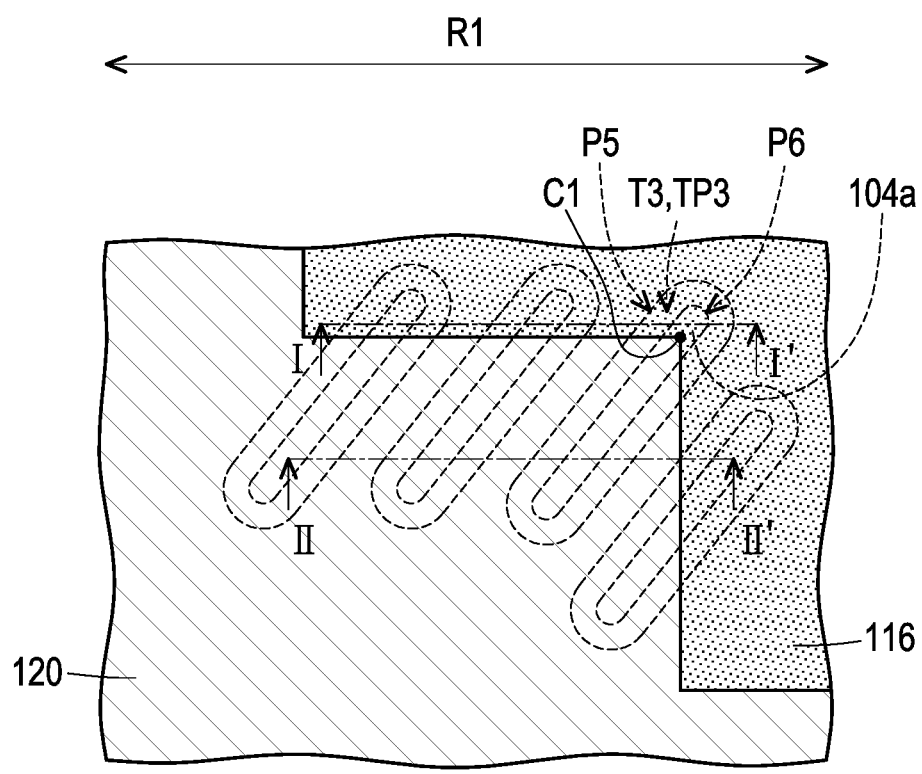
Figure 2F:
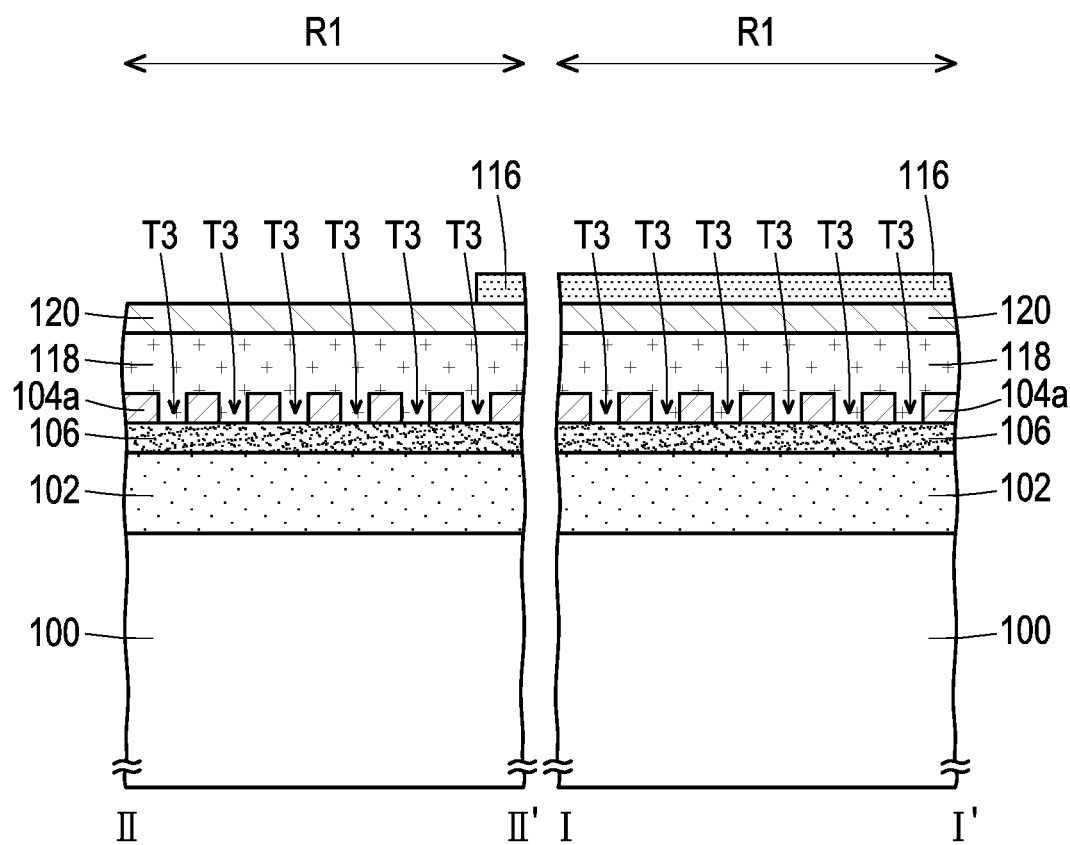

Referring to FIG. 1F and FIG. 2F, a patterned photoresist layer 116 may be formed on the patterned mask layer 104a, wherein the patterned photoresist layer 116 is located directly above a portion of the patterned mask layer 104a. In some embodiments, as shown in FIG. 1F, the top-view pattern of the patterned photoresist layer 116 may include an L-shape, the patterned photoresist layer 116 may have a right-angled corner C1, and the vertical projection of the right-angled corner C1 may be located inside the inner contour P6. The patterned photoresist layer 116 may be formed by a lithography process.

In some embodiments, before the patterned photoresist layer 116 is formed, a planarization layer 118 may be formed on the patterned mask layer 104a. The planarization layer 118 may fill the trench T3, and the planarization layer 118 may be further formed on the mask layer 106. The material of the planarization layer 118 is, for example, spin on carbon (SOC). The method of forming the planarization layer 118 is, for example, a spin coating method. In some embodiments, an anti-reflection layer 120 may be formed on the planarization layer 118. The patterned photoresist layer 116 may be formed on the anti-reflection layer 120. The anti-reflection layer 120 is, for example, a spin on silicon anti-reflection coating (SOSA). The method of forming the anti-reflection layer 120 is, for example, a spin coating method.

Figure 1G:
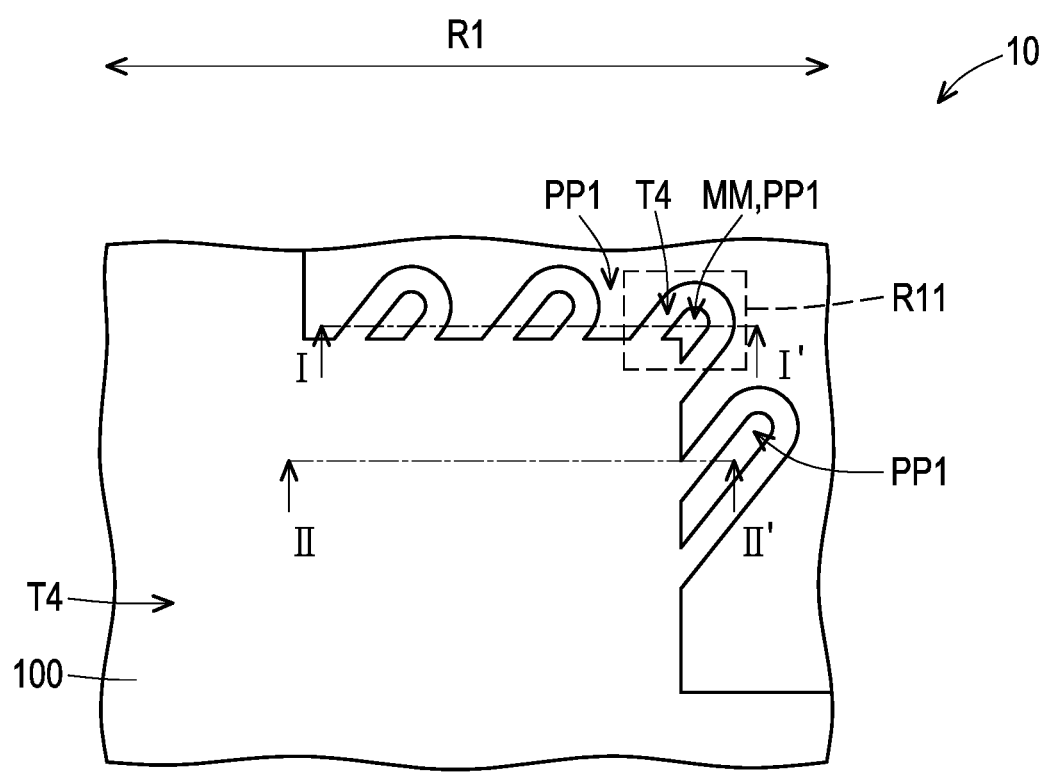
Figure 2G:
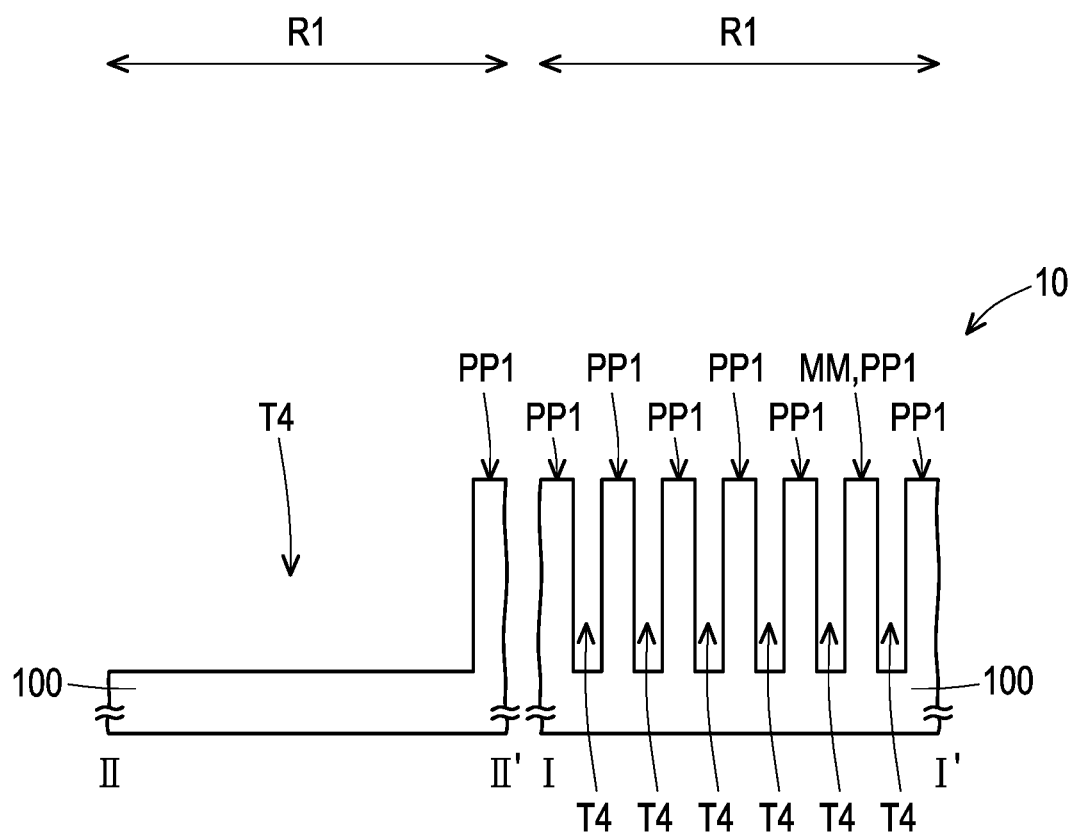

Referring to FIG. 1G and FIG. 2G, an etching process may be performed by using the patterned photoresist layer 116 as a mask, so that a trench T4 may be formed in the substrate 100, and the substrate 100 may have a protrusion portion PP1. The protrusion portion PP1 may include a monitoring mark MM (FIG. 1G). That is, the monitoring mark MM may be a portion of the protrusion portion PP1. Therefore, the monitoring mark MM may be formed in the monitoring region R1. In some embodiments, in the etching process, the pattern of the patterned mask layer 104a is defined as a pattern for forming the protrusion portion PP1, and then the pattern for forming the protrusion portion PP1 is transferred to the substrate 100. In some embodiments, the patterned photoresist layer 116, the anti-reflection layer 120, the planarization layer 118, the patterned mask layer 104a, the mask layer 106, the mask layer 102, and a portion of the substrate 100 may be removed in the etching process. In some embodiments, the etching process is, for example, a dry etching process.

Hereinafter, the semiconductor structure 10 of the present embodiment will be described with reference to FIG. 2G, FIG. 3, and FIG. 4. In addition, although the method for forming the semiconductor structure 10 is described by taking the above method as an example, the invention is not limited thereto.

Figure 3:
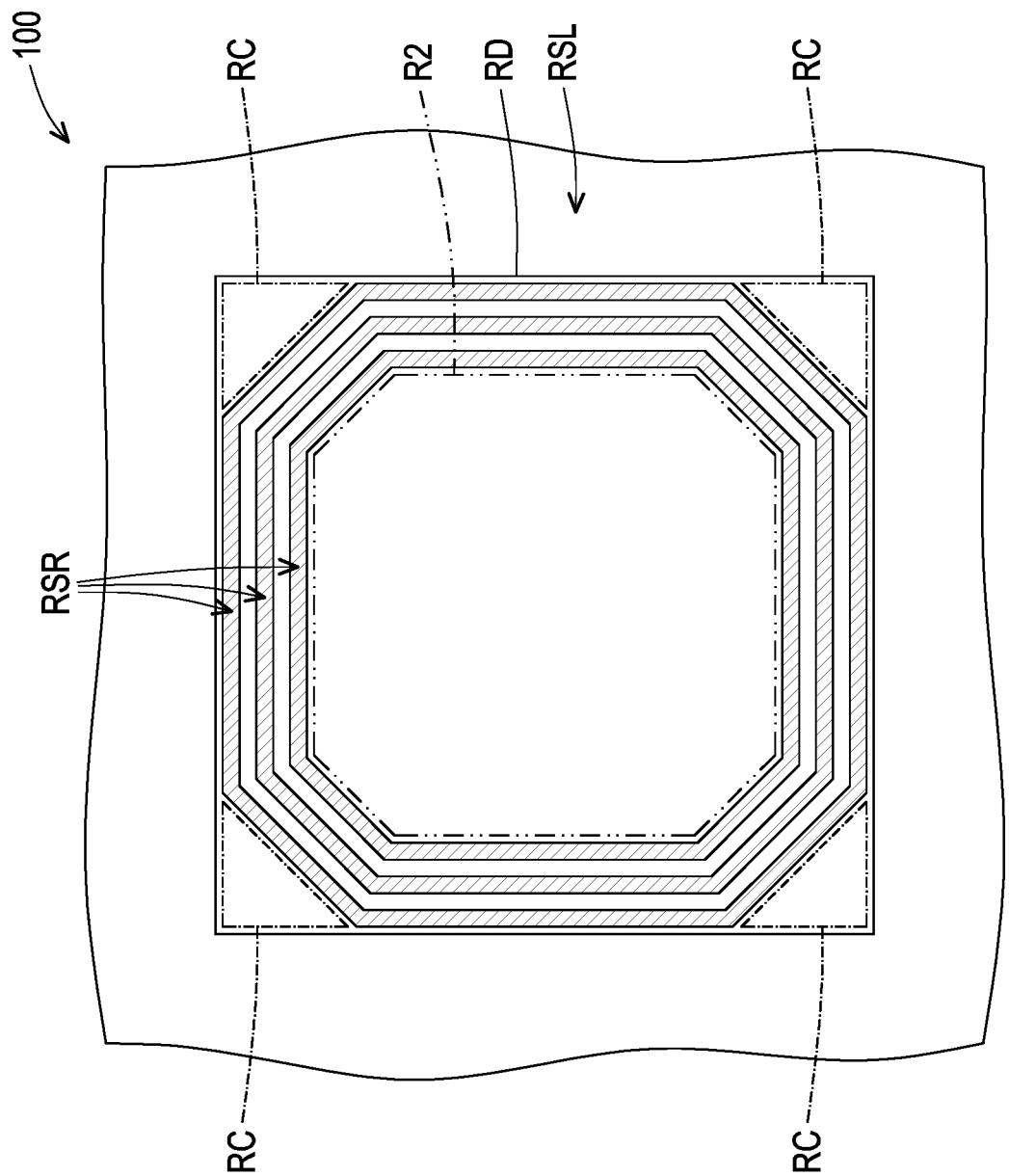
FIG. 3 is a top view illustrating a substrate according to some embodiments of the invention.

FIG. 3 is a top view illustrating a substrate according to some embodiments of the invention. FIG. 4 is a top view illustrating a semiconductor structure according to some embodiments of the invention. In addition, the monitoring region R1 in FIG. 4 is a partially enlarged view of the region R11 in FIG. 1G.

Figure 4:
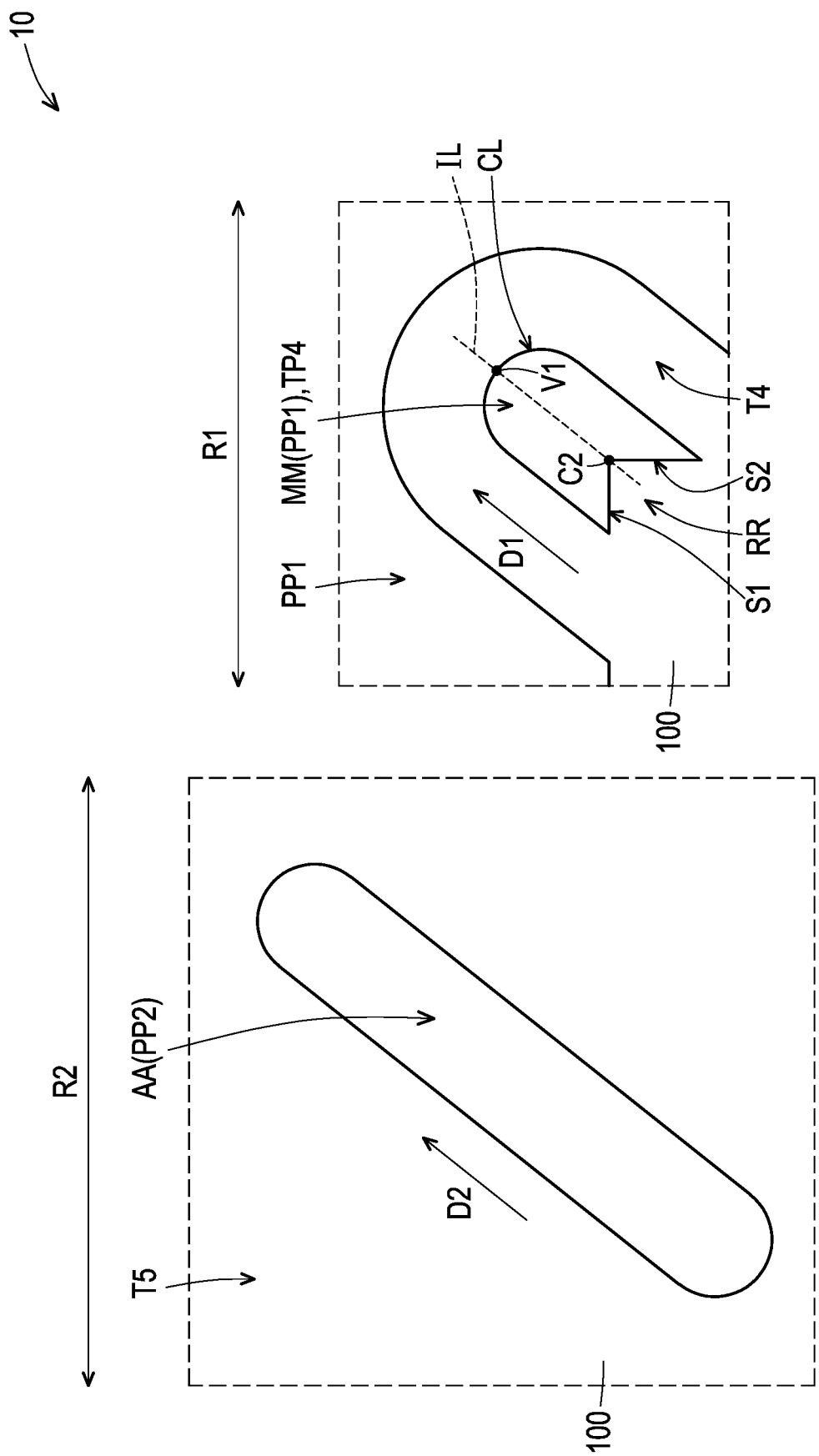
FIG. 4 is a top view illustrating a semiconductor structure according to some embodiments of the invention.

Referring to FIG. 2G, FIG. 3, and FIG. 4, the semiconductor structure 10 includes a substrate 100 and a monitoring mark MM. The substrate 100 includes a monitoring region R1. In addition, the substrate 100 may further include a device region R2. As shown in FIG. 3, the substrate 100 may include a die region RD and a scribe line region RSL. The scribe line region RSL is located outside the die region RD. In addition, the substrate 100 may further include a seal ring region RSR and a corner region RC. The sealing ring region RSR and the corner region RC are located in the die region RD. The corner region RC may be located between the scribe line region RSL and the seal ring region RSR. The sealing ring region RSR may surround the device region R2. The monitoring region R1 may be located in the die region RD. In some embodiments, the monitoring region R1 may be located in the corner region RC. In other embodiments, the monitoring region R1 may be located in an empty region or a dummy region of the device region R2, but the invention is not limited thereto. As long as the monitoring region R1 is located in the die region RD, it falls within the scope of the invention.

Referring to FIG. 2G and FIG. 4, the monitoring mark MM is located in the monitoring region R1. In some embodiments, the substrate 100 may have a protrusion portion PP1. The protrusion portion PP1 may include the monitoring mark MM. That is, the monitoring mark MM may be a portion of the substrate 100. There may be a trench T4 in the substrate 100. The trench T4 may surround the monitoring mark MM.

The top-view pattern TP4 of the monitoring mark MM includes a curved line CL and a recess RR. The curved line CL and the recess RR are opposite to each other, the curved line CL has a vertex V1, and the recess RR has a right-angled corner C2. In some embodiments, the curved line CL may be an arc line. In some embodiments, the monitoring mark MM may include a side S1 and a side S2 that are connected to the right-angled corner C2. In the present embodiment, the side length of the side S1 may be smaller than the side length of the side S2, but the invention is not limited thereto. In other embodiments, the side length of the side S1 may be greater than or equal to the side length of the side S2. In some embodiments, the imaginary straight line IL passing through the vertex V1 and the right-angled corner C2 may be parallel to the extension direction D1 of the monitoring mark MM.

The semiconductor structure 10 may further include an active region AA. The active region AA is located in the device region R2. In some embodiments, there may be a trench T5 in the substrate 100. The trench T5 may surround the active region AA, and the active region AA may be a protrusion portion PP2 of the substrate 100. That is, the active region AA may be a portion of the substrate 100. The extension direction D2 of the active region AA may be parallel to the extension direction D1 of the monitoring mark MM. The extension direction D2 of the active region AA may be parallel to the imaginary straight line IL passing through the vertex V1 and the right-angled corner C2. In some embodiments, the active region AA and the monitoring mark MM may be simultaneously formed.

Based on the above embodiments, in the semiconductor structure 10 and the manufacturing method thereof, the top-view pattern TP4 of the monitoring mark MM includes the curved line CL and the recess RR, the curved line CL and the recess RR are opposite to each other, the curved line CL has the vertex V1, and the recess RR has the right-angled corner C2. In this way, when the monitoring mark MM is used to monitor whether the active region AA is shifted in the extension direction D2 of the active region AA, the distance between the vertex V1 and the right-angled corner C2 may be measured first, and then the above-measured distance may be compared with the preset distance between the vertex V1 and the right-angled corner C2. Therefore, whether the active region AA is shifted in the extension direction D2 of the active region AA can be monitored, and the offset of the active region AA in the extension direction D2 of the active region AA can be measured.

In addition, when the monitoring mark MM is used to monitor whether the active region AA is shifted in the X direction and/or the Y direction, the side lengths of two sides (e.g., side S1 and side C2) connected to the right-angled corner C2 of the monitoring mark MM may be measured first, and then the above-measured side lengths may be compared with the preset side lengths of two sides (e.g., side S1 and side C2) connected to the right-angled corner C2 of the monitoring mark MM. Therefore, whether the active region AA is shifted in the X direction and/or the Y direction can be monitored, and the offset of the active region AA in the X direction and/or the Y direction can be measured. For example, whether the active region AA is shifted in the X direction can be monitored by the side S1, and whether the active region AA is shifted in the Y direction can be monitored by the side S2.

In summary, in the semiconductor structure and the manufacturing method of the aforementioned embodiment, the top-view pattern of the monitoring mark includes the curved line and the recess, the curved line and the recess are opposite to each other, the curved line has the vertex, and the recess has the right-angled corner. Therefore, the monitoring mark can be used to monitor whether the active region is shifted in the extension direction of the active region, the X direction, and/or the Y direction, and the monitoring mark can be used to measure the offset of the active region in the extension direction of the active region, the X direction, and/or the Y direction.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:
    a substrate comprising a monitoring region; and
    a monitoring mark located in the monitoring region, wherein a top-view pattern of the monitoring mark comprises a curved line and a recess, the curved line and the recess are opposite to each other, the curved line has a vertex, the recess has a right-angled corner, and the monitoring mark is integrally formed.

2. The semiconductor structure according to claim 1, wherein the substrate comprises a die region and a scribe line region, the scribe line region is located outside the die region, and the monitoring region is located in the die region.

3. The semiconductor structure according to claim 1, wherein the monitoring mark is a portion of the substrate.

4. The semiconductor structure according to claim 1, wherein there is a trench in the substrate, and the trench surrounds the monitoring mark.

5. The semiconductor structure according to claim 1, wherein an imaginary straight line passing through the vertex and the right-angled corner is parallel to an extension direction of the monitoring mark.

6. The semiconductor structure according to claim 1, wherein the substrate further comprises a device region, and the semiconductor structure further comprises:
    an active region located in the device region.

7. The semiconductor structure according to claim 6, wherein the active region is a portion of the substrate.

8. The semiconductor structure according to claim 6, wherein there is a trench in the substrate, and the trench surrounds the active region.

9. The semiconductor structure according to claim 6, wherein an extension direction of the active region is parallel to an extension direction of the monitoring mark.

10. The semiconductor structure according to claim 6, wherein an extension direction of the active region is parallel to an imaginary straight line passing through the vertex and the right-angled corner.

11. A manufacturing method of a semiconductor structure, comprising:

providing a substrate, wherein the substrate comprises a monitoring region; and forming a monitoring mark in the monitoring region, wherein a top-view pattern of the monitoring mark comprises a curved line and a recess, the curved line and the recess are opposite to each other, the curved line has a vertex, the recess has a first right-angled corner, and the monitoring mark is integrally formed.

12. The manufacturing method of the semiconductor structure according to claim 11, wherein a method of forming the monitoring mark comprises:

forming a first mask layer on the substrate;

forming a second mask layer on the first mask layer;

forming a first patterned mask layer on the second mask layer, wherein a top-view pattern of the first patterned mask layer comprises a first ring-shaped pattern, the first ring-shaped pattern comprises a first outer contour and a first inner contour, the first outer contour surrounds the first inner contour, contour lines of two sides of the first outer contour comprise curves, contour lines of two sides of the first inner contour comprise curves, there are first trenches in the first patterned mask layer, and the first trenches are located on two sides of the first ring-shaped pattern and in the first ring-shaped pattern;

forming a filling layer in the first trenches;

removing the first patterned mask layer, so that the filling layer has a second trench, a top-view pattern of the second trench comprises a second ring-shaped pattern, the second ring-shaped pattern comprises a second outer contour and a second inner contour, the second outer contour surrounds the second inner contour, contour lines of two sides of the second outer contour comprise curves, and contour lines of two sides of the second inner contour comprise curves;

transferring a pattern of the filling layer to the second mask layer to form a second patterned mask layer, wherein the second patterned mask layer has a third trench, a top-view pattern of the third trench comprises a third ring-shaped pattern, the third ring-shaped pattern comprises a third outer contour and a third inner contour, the third outer contour surrounds the third inner contour, contour lines of two sides of the third outer contour comprise curves, and contour lines of two sides of the third inner contour comprise curves;

forming a patterned photoresist layer on the second patterned mask layer, wherein the patterned photoresist layer is located directly above a portion of the second patterned mask layer; and performing an etching process by using the patterned photoresist layer as a mask, so that a fourth trench is formed in the substrate, and the substrate has a protrusion portion, wherein the protrusion portion comprises the monitoring mark.

13. The manufacturing method of the semiconductor structure according to claim 12, wherein a method of forming the first patterned mask layer comprises performing a self-aligned double patterning process.

14. The manufacturing method of the semiconductor structure according to claim 12, wherein a top-view pattern of the patterned photoresist layer comprises an L-shape, the patterned photoresist layer has a second right-angled corner, and a vertical projection of the second right-angled corner is located inside the third inner contour.

15. The manufacturing method of the semiconductor structure according to claim 12, wherein a method of forming the filling layer comprises:

forming a filling material layer on the first patterned mask layer, wherein the filling material layer fills the first trenches; and removing the filling material layer located outside the first trenches to form the filling layer.

16. The manufacturing method of the semiconductor structure according to claim 15, wherein a method of removing the filling material layer located outside the first trenches comprises an etch-back method.

17. The manufacturing method of the semiconductor structure according to claim 12, wherein the filling layer and a portion of the second mask layer are removed during the process of forming the second patterned mask layer.

18. The manufacturing method of the semiconductor structure according to claim 12, wherein the method of forming the monitoring mark further comprises:

before forming the patterned photoresist layer, forming a planarization layer on the second patterned mask layer; and forming an anti-reflection layer on the planarization layer.

19. The manufacturing method of the semiconductor structure according to claim 12, wherein in the etching process, a pattern of the second patterned mask layer is defined as a pattern for forming the protrusion portion, and then the pattern for forming the protrusion portion is transferred to the substrate.

20. The manufacturing method of the semiconductor structure according to claim 12, wherein the patterned photoresist layer, the second patterned mask layer, the first mask layer, and a portion of the substrate are removed in the etching process.

* * * * *